(12) United States Patent
Rao et al.

(10) Patent No.: US 8,912,823 B2
(45) Date of Patent: Dec. 16, 2014

(54) VOLTAGE COMPENSATED LEVEL-SHIFTER

(75) Inventors: Venkatesh Rao, Bangalore (IN); Alok Shah, Bangalore (IN); Pravas Pradhan, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/992,885

(22) PCT Filed: Dec. 8, 2011

(86) PCT No.: PCT/US2011/063938
§ 371 (c)(1),
(2), (4) Date: Jun. 10, 2013

(87) PCT Pub. No.: WO2013/085520
PCT Pub. Date: Jun. 13, 2013

(65) Prior Publication Data
US 2013/0321026 A1 Dec. 5, 2013

(51) Int. Cl.
*H03K 19/0185* (2006.01)
*H03K 19/00* (2006.01)
*H03K 19/003* (2006.01)

(52) U.S. Cl.
CPC .... *H03K 19/018521* (2013.01); *H03K 19/0013* (2013.01); *H03K 19/00384* (2013.01)
USPC .................................. 326/83; 326/81; 326/68

(58) Field of Classification Search
None
See application file for complete search history.

(56) References Cited

U.S. PATENT DOCUMENTS

| 7,215,146 B2 * | 5/2007 | Khan ............................... 326/83 |
| 7,671,656 B2 | 3/2010 | Nomura |
| 7,839,170 B1 * | 11/2010 | Yang et al. ...................... 326/68 |
| 8,698,356 B2 * | 4/2014 | Kimura .......................... 307/113 |
| 2003/0222700 A1 | 12/2003 | Carpenter et al. |
| 2004/0095159 A1 * | 5/2004 | Kimura ........................... 326/33 |
| 2005/0134312 A1 | 6/2005 | Seo |
| 2009/0002027 A1 | 1/2009 | Lee |
| 2009/0237139 A1 | 9/2009 | Kang |

OTHER PUBLICATIONS

Int'l Search Report and Written Opinion mailed Aug. 24, 2012 for Int'l Patent Application No. PCT/US2011/063938.

* cited by examiner

*Primary Examiner* — Crystal L Hammond
(74) *Attorney, Agent, or Firm* — Blakely, Sokoloff, Taylor & Zafman LLP

(57) ABSTRACT

Described herein is a voltage compensated level-shifter with nearly constant duty cycle and matching rise and fall slopes of the output of the level-shifter, no meta-stability, and nearly constant propagation delay across power supply levels. The voltage compensated level-shifter comprises a first inverter to receive an input signal for level shifting from a first power supply level to a second power supply level, and to generate a first inverted signal, the first inverter operating on the first power supply level; a second inverter to receive the input signal and to generate a second inverted signal, the second inverter operating on the second power supply level; and a NOR logical gate to receive the first and second inverted signals and to generate an output signal, the NOR logical gate operating on the second power supply level, wherein the output signal is level shifted to the second power supply level.

23 Claims, 9 Drawing Sheets

500

```
┌─────────────────────────────────────────────────────────────┐
│ Receive an input signal for level shifting from a first     │
│ power supply level to a second power supply level           │
│                         501                                  │
└─────────────────────────────────────────────────────────────┘
                              │
                              ▼
┌─────────────────────────────────────────────────────────────┐
│ Generate a first inverted signal by inverting the input      │
│ signal, the first inverted signal having a logical high      │
│ level of the first power supply level                        │
│                         502                                  │
└─────────────────────────────────────────────────────────────┘
                              │
                              ▼
┌─────────────────────────────────────────────────────────────┐
│ Generate a second inverted signal by inverting the input     │
│ signal, the second inverted signal having a logical high     │
│ level of the second power supply level                       │
│                         503                                  │
└─────────────────────────────────────────────────────────────┘
                              │
                              ▼
┌─────────────────────────────────────────────────────────────┐
│ Apply NOR operation to inputs comprising first and second    │
│ inverted signals to generate a level shifted output signal   │
│                         504                                  │
└─────────────────────────────────────────────────────────────┘
```

FIG. 5

VOLTAGE COMPENSATED LEVEL-SHIFTER

CLAIM OF PRIORITY

This application claims the benefit of priority of International Patent Application No. PCT/US2011/063938 filed Dec. 8, 2011, titled "VOLTAGE COMPENSATED LEVEL-SHIFTER," which is incorporated by reference in its entirety.

FIELD OF THE INVENTION

Embodiments of the invention relate generally to the field of processors. More particularly, embodiments of the invention relate to a voltage compensated level-shifter.

BACKGROUND

Level-shifters are typically deployed at locations where signals transition from a low voltage power supply domain to a high voltage power supply domain. FIG. 1 is a conventional cross-coupled level-shifter 100 with cross-coupled P-transistors MP1 and MP2 connected to pull-down N-transistors MN1 and MN2 respectively. The high voltage power supply domain VCCH connects to the P-transistors MP1 and MP2 while the signals (IN and INBL) generated in the low voltage power supply domain VCCL control the gates of the pull-down N-transistors MN1 and MN2, where INBL is generated by an inverter INV1 operating on VCCL power supply. The signal OUT is the level-shifted signal, i.e. the signal OUT (unlike IN signal) has a logical high level nearly equal to VCCH power supply level. The signal OUT can be driven by another inverter INV2 that generates OUTB, where INV2 operates on the VCCH power supply level.

Level-shifters, such as level-shifter 100, add to the overall power dissipation of the processor that comprises the level-shifter 100. The power dissipation increases as the voltage difference between VCCH and VCCL power supply levels increase. The level-shifter 100 is designed for a certain small range of process, temperature, and voltage (PVT), i.e. for specific VCCL and VCCH power supply levels to generate an OUT signal with specific duty cycle and rise/fall signal slopes, and with specific propagation delay.

As signal speed (e.g., frequency of signal IN) increases and the available power supply voltage level, i.e. VCCL, decreases (e.g., decreasing from 1.2V to 0.7V and lower), the conventional cross-coupled level-shifter 100 begins to suffer from duty cycle degradation, higher propagation delay, and non-uniform rise and fall slopes of the signal OUT. A non-50% duty cycle of the OUT signal may reduce timing margins at clock domain crossings as the OUT signal propagates through various clock domains.

Generally, to optimize the level-shifter 100 for a certain PVT, and for specific VCCL and VCCH power supply levels to generate an OUT signal with a certain duty cycle and rise/fall signal slopes, and with certain propagation delay, the size (W/L) of the P-transistors MP1 and MP2 are selected to balance the cross-coupling operation of the P-transistor latch (MP1 and MP2) and the pull-down strength of the N-transistors MN1 and MN2. However, for a certain range of PVT conditions and large difference between power supply voltage levels VCCH and VCCL, the latch of the level-shifter 100 exhibits meta-stability resulting in increased propagation delay and non-50% duty cycle at the signal OUT.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

FIG. 5 is a method flowchart for generating a voltage compensated output from the voltage compensated level-shifter, according to one embodiment of the invention.

SUMMARY

Figure 1:
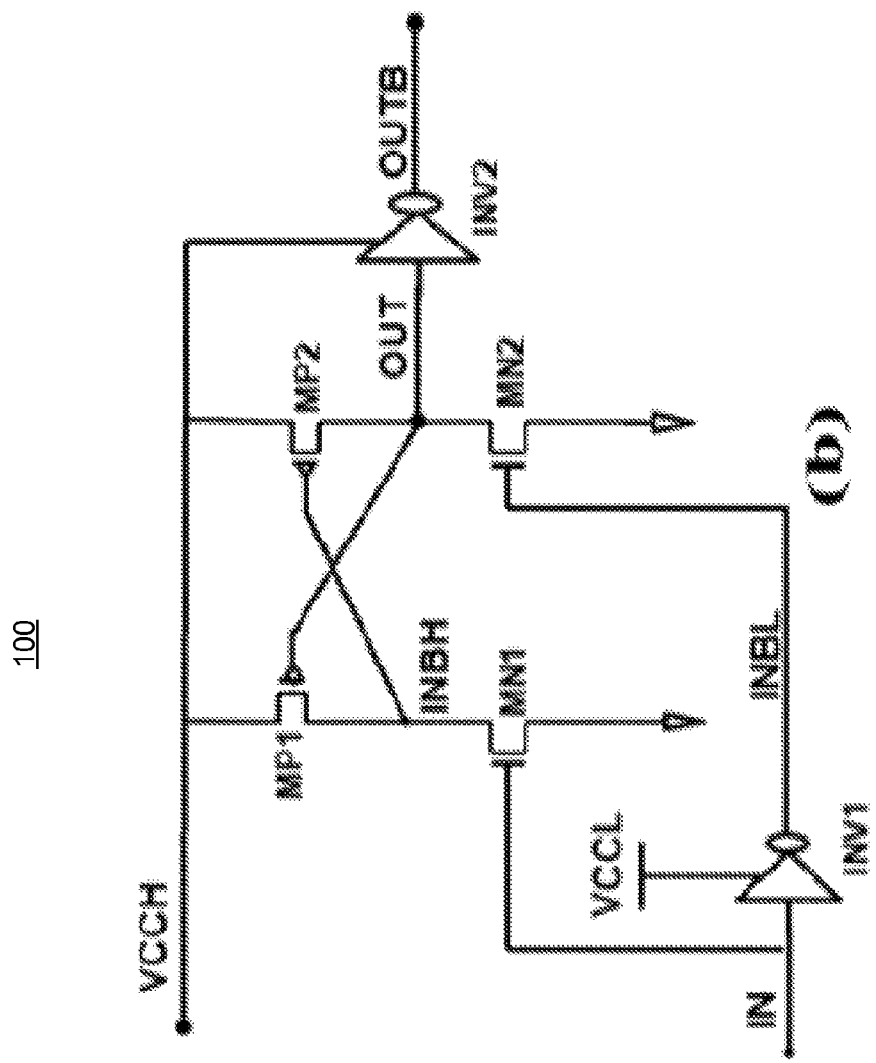
FIG. 1 is a conventional cross-coupled level-shifter.

The following presents a simplified summary of the embodiments of the invention in order to provide a basic understanding of some aspects of the embodiments. This summary is not an extensive overview of the embodiments of the invention. It is intended to neither identify key or critical elements of the embodiments nor delineate the scope of the embodiments. Its sole purpose is to present some concepts of the embodiments of the invention in a simplified form as a prelude to the more detailed description that is presented later.

Embodiments of the invention relate to a voltage compensated level-shifter which can operate at low power supply voltages without degrading its performance as measured in terms of 50% duty cycle of the output of the level-shifter, matching (i.e. equal) rise and fall slopes of the output of the level-shifter, no meta-stability, and nearly constant propagation delay across power supply levels.

In one embodiment, the apparatus comprises: a first inverter to receive an input signal for level shifting from a first power supply level to a second power supply level, and to generate a first inverted signal, the first inverter operating on the first power supply level; a second inverter to receive the input signal and to generate a second inverted signal, the second inverter operating on the second power supply level; and a NOR logical gate to receive the first and second inverted signals and to generate an output signal, the NOR logical gate operating on the second power supply level, wherein the output signal is level shifted to the second power supply level.

In one embodiment, the method comprises: receiving an input signal for level shifting from a first power supply level to a second power supply level; generating a first inverted signal by inverting the input signal, the first inverted signal having a logical high level of the first power supply level; generating a second inverted signal by inverting the input signal, the second inverted signal having a logical high level of the second power supply level; and applying a logical NOR operation to inputs comprising the first and second inverted signals, the logical NOR operation to generate an output signal which is level shifted to the second power supply level.

In one embodiment, the system comprises: a display unit; and a processor coupled to the display unit, the processor including a level shifter comprising: a first inverter to receive an input signal for level shifting from a first power supply level to a second power supply level, and to generate a first inverted signal, the first inverter operating on the first power supply level; a second inverter to receive the input signal and to generate a second inverted signal, the second inverter operating on the second power supply level; and a NOR logical gate to receive the first and second inverted signals and to generate an output signal, the NOR logical gate operating on the second power supply level, wherein the output signal is level shifted to the second power supply level.

While the summary of the invention has been described in conjunction with specific embodiments thereof, many alternatives, modifications and variations of such embodiments will be apparent to those of ordinary skill in the art in light of the foregoing description. For example, to further reduce leakage in the second inverter, more than two P-transistors may be stacked from the second power supply node to the output node of the second inverter. The embodiments of the invention are intended to embrace all such alternatives, modifications, and variations as to fall within the broad scope of the appended claims.

The following description and the annexed drawings set forth in detail certain illustrative aspects of the embodiments of the invention. These aspects are indicative, however, of but a few of the various ways in which the principles of the embodiments of the invention may be employed. The embodiments of the invention are intended to embrace all equivalents in the form of alternatives, modifications, and variations that fall within the broad scope of the appended claims. Other advantages and novel features of the embodiments of the invention will become apparent from the following detailed description of the embodiments of the invention when considered in conjunction with the drawings.

DETAILED DESCRIPTION

Embodiments of the invention relate to a voltage compensated level-shifter which can operate at low power supply voltages without degrading its performance as measured in terms of 50% duty cycle of the output of the level-shifter, matching (i.e. equal) rise and fall slopes of the output of the level-shifter, no meta-stability, and nearly constant propagation delay across power supply levels.

The term "duty cycle" herein refers to a ratio of high phase versus low phase of a signal cycle. A 50% duty cycle means equal high and low phases of the signal. A 25% duty cycle means that the high phase is 25% of the total signal cycle while the rest of the signal cycle is low phase, i.e. 75%.

The term "slope" herein refers to rise and/or fall time times of a signal. Slopes are measures from 10% (or 20%) of the logical low level of the signal to the 90% (or 80%) of the logical high level of the signal. Other measuring points can also be used to generate the rise and fall times of a signal.

The term "propagation delay" herein refers to delay from input of a circuit to an output of the circuit, i.e. how long it takes for an input signal to propagate to the output of the circuit. It may be measured from the mid-point of a transition edge of the input signal to the mid-point of a transition edge of the output signal. The mid-point may be the 50% voltage mark.

The term "nearly" or "substantially" herein refers to being within 20% of the target value. For example, the term "nearly constant rise and fall times" means that the rise time and fall time of a signal are within 20% of each other.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

In the following description and claims, the term "coupled" and its derivatives may be used. The term "coupled" herein refers to two or more elements which are in direct contact (physically, electrically, magnetically, optically, etc.). The term "coupled" herein may also refer to two or more elements that are not in direct contact with each other, but still cooperate or interact with each other.

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

Figure 2:
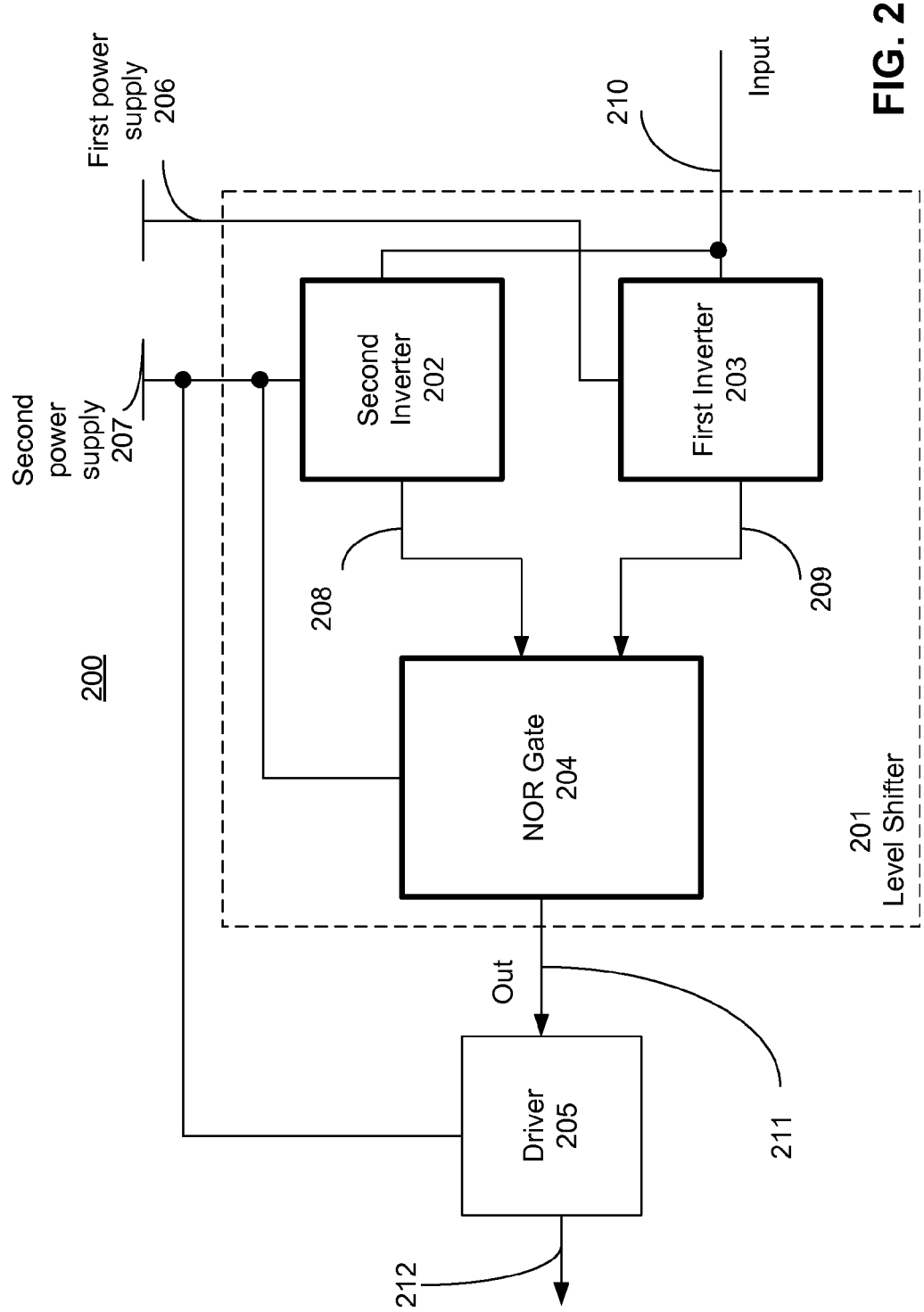
FIG. 2 is a high level diagram of a voltage compensated level-shifter, according to one embodiment of the invention.

FIG. 2 is a high level diagram 200 of a voltage compensated level-shifter 201, according to one embodiment of the invention. In one embodiment, the voltage compensated level-shifter 201 comprises a first inverter 203 to receive an input signal 210 for level shifting from a first power supply level 206 to a second power supply level 207, and to generate a first inverted signal 209, the first inverter operating on the first power supply level 206. The second power supply level 207 is higher than the first power supply level 206. For example, the second power supply level 207 is 1.2V while the first power supply level 206 is 0.8V.

In this embodiment, the voltage compensated level-shifter 201 further comprises a second inverter 202 to receive the input signal 210 and to generate a second inverted signal 208, the second inverter 202 operating on the second power supply level 207. In the embodiments discussed herein, the first inverted signal 209 has a signal swing between the first power supply level 206 (e.g., VCCL) and the ground logic level (e.g., VSS), while the second inverted signal 208 has a signal swing between the second power supply level 207 (e.g., VCCH) and ground level (e.g., VSS).

In one embodiment, the voltage compensated level-shifter 201 further comprises a NOR logical gate 204 to receive the first and second inverted signals, 209 and 208, and to generate an output signal 211, where the NOR logical gate 204 is operating on the second power supply level 207, and where the output signal 211 is level-shifted to the second power supply level 207.

The N-transistors of the NOR logical gate receive signals 208 and 209 respectively. These N-transistors compensate for duty cycle degradation and provide nearly constant rise and fall times for the signal 211. Unlike the cross-coupled level-shifter 100 of FIG. 1, the voltage compensated level-shifter 201 is an open loop design and has no cross-coupled transistors, and thus the voltage compensated level-shifter 201 eliminates any meta-stability issues exhibited by the level-shifter of FIG. 1. Power dissipation caused by current leakage in the transistors of the second inverter 202 is also reduced by cascoding, i.e. stacking, the P-devices in the second inverter 202, according to one embodiment of the invention. In the embodiments discussed herein, the average power dissipation of the voltage compensated level-shifter 201 is lower by 20% compared to the cross-coupled level-shifter 100 of FIG. 1, for driving the same load with input signal being a periodic signal.

In one embodiment, the output signal 211 of the voltage compensated level-shifter 201 is driven by a driver 205 which operates on the second power supply level 207 to generate a stronger signal 212. Strong signal refers to a signal with higher drive strength. In one embodiment, the driver 205 is an inverter. In another embodiment, the driver 205 is a buffer.

Figure 3:
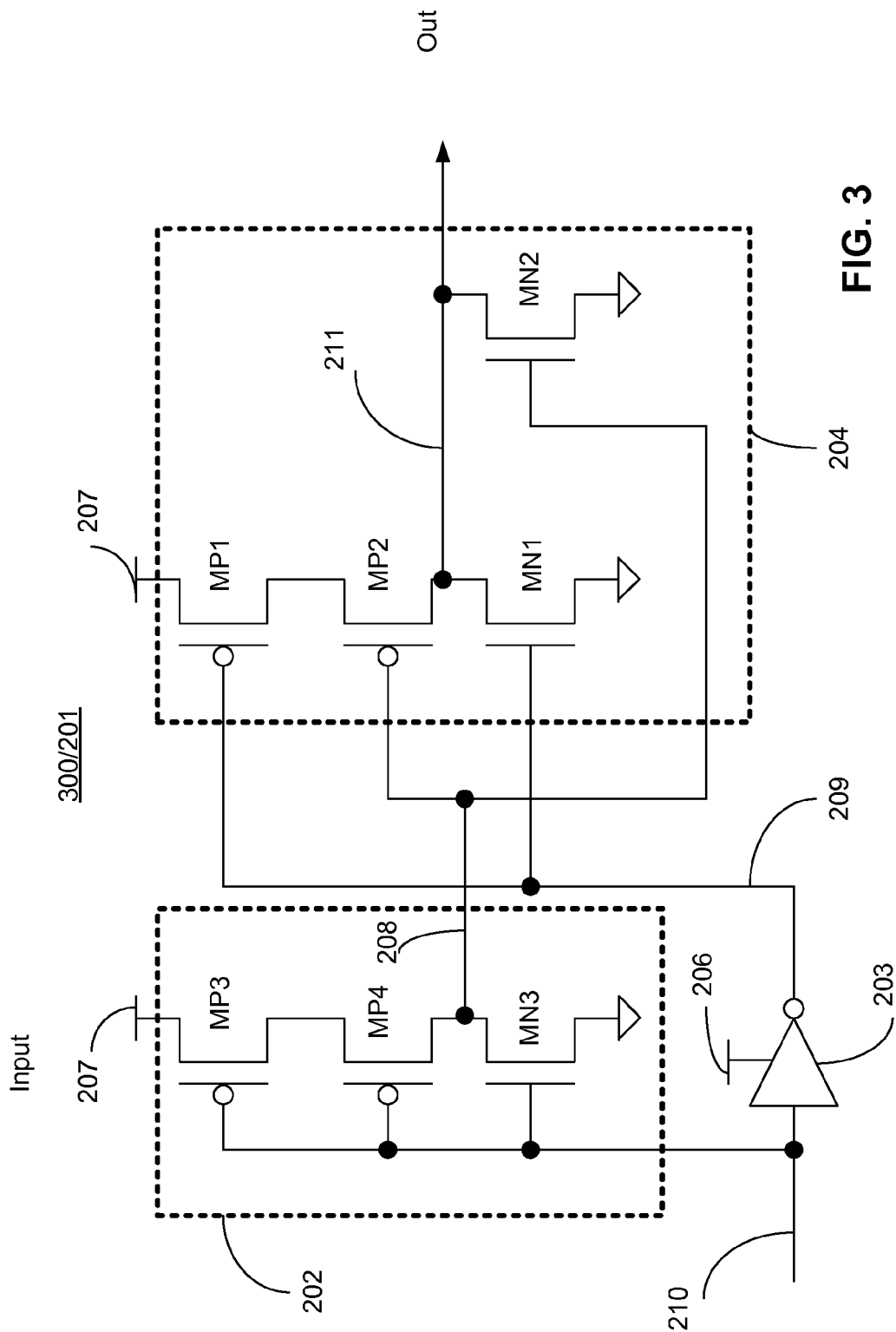
FIG. 3 is circuit level implementation of the voltage compensated level-shifter, according to one embodiment of the invention.

FIG. 3 is circuit level implementation of the voltage compensated level-shifter 300/201, according to one embodiment of the invention. FIG. 3 is described with reference to FIG. 2 and FIGS. 6A-C. In one embodiment, the second inverter 203 comprises two cascode P-transistors MP3 and MP4 (also called first and second P-transistors) connected in series with one another and with an N-transistor MN3. The gates of the P-transistors MP3 and MP4 and the N-transistor MN3 receive the input signal 210, which swings between ground level and first power supply level 206, and generate the second inverted signal 208. In one embodiment, more than two P-transistors can be stacked in series with one another, i.e. longer cascode, to further reduce leakage in the P-transistor MP4. In one embodiment, leakage is reduced by reducing the Vds across the P-transistor MP4.

In one embodiment, the NOR logical gate 204 comprises at least four transistors including P-transistors MP1 and MP2 (also called first and second P-transistors), and N-transistors MN1 and MN2 (also called first and second N-transistors). The NOR logical gate 204 operates on the second power supply level 207 which is higher than the first power supply level 206. In one embodiment, the N-transistor MN1 receives the first inverted signal 209 at its gate terminal while the N-transistor MN2 receives the second inverted signal 209 at its gate terminal. As mentioned above, the first inverted signal 209 has a signal swing between the first power supply level (e.g., VCCL) and the ground logic level (e.g., VSS), while the second inverted signal 208 has a signal swing between the second power supply level 207 (e.g., VCCH) and ground level (e.g., VSS), where VCCH power supply level is higher than VCCL power supply level.

In the embodiments discussed herein, slope compensation is performed by providing different voltage swing signals to the N and P transistors of the NOR gate 204. The N-transistors MN1 and MN2 receive signals with different voltage level swings. The P-transistors MP1 and MP2 also receive signals with different voltage level swings.

For example, the pull-down path at the node carrying the signal 211 is driven by both the voltage levels—the first power supply voltage level (e.g., VCCL) and the second power supply voltage level (e.g., VCCH). In this embodiment, when the difference between the two power supply levels increases, slope degradation due to lower VCCL power supply level is compensated by the parallel path driven by the higher VCCH power supply level. The pull-up path, from the node having the second power supply level 207 to the node carrying the signal 211, is also driven by both the voltage levels—first power supply voltage level 206 (e.g., VCCL) and the second power supply voltage level (e.g., VCCH).

In this embodiment, the slope compensation caused by providing different voltage swing signals to the N and P-transistors of the NOR gate 204 for the pull-up and pull-down paths provides nearly 50% duty cycle performance for signal 211 over a wide voltage power supply voltage range, and nearly constant rise and fall times of the signal 211 over a wide voltage power supply voltage range.

Figure 6A:
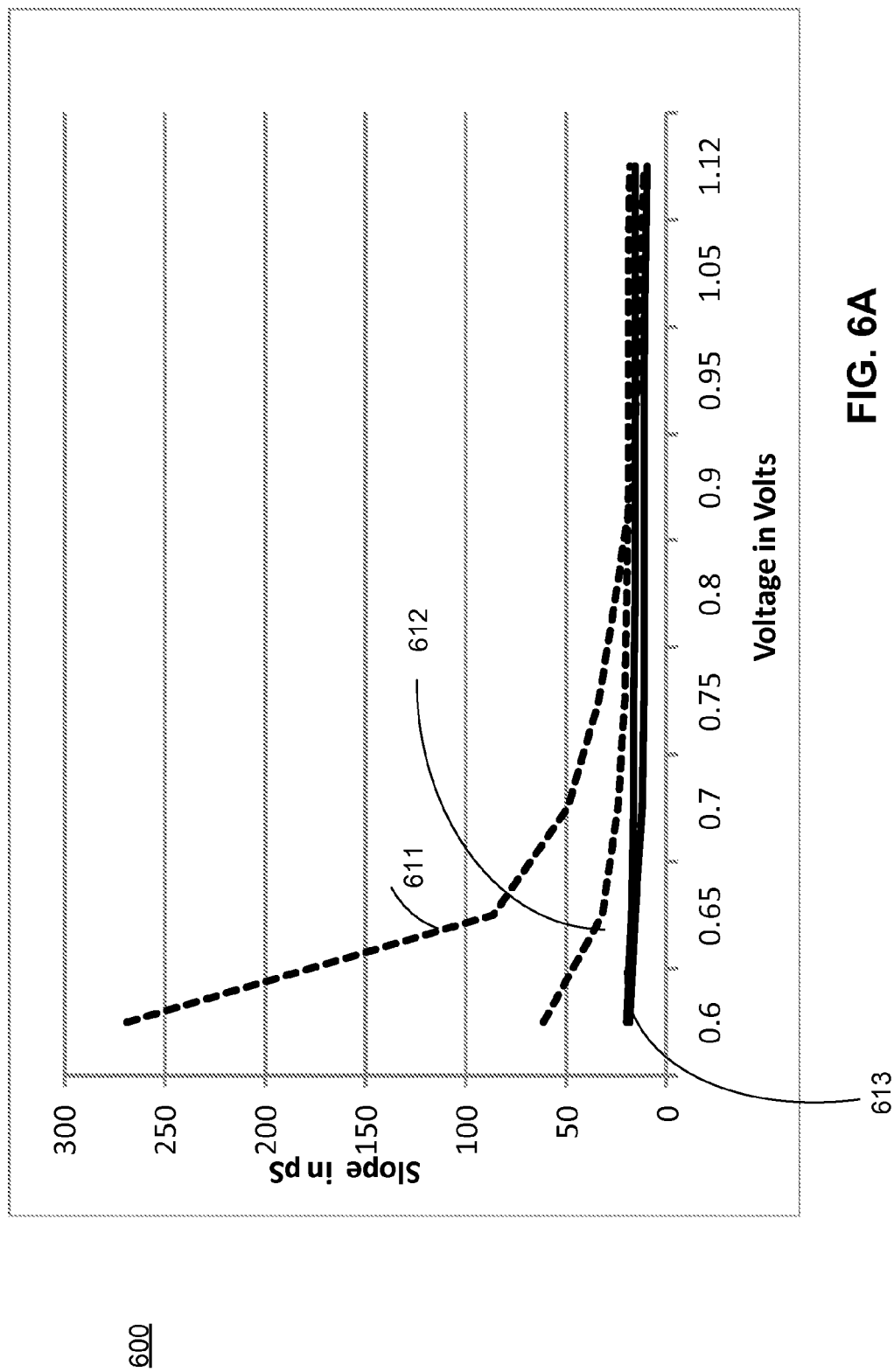
FIG. 6A is a graph comparing the voltage compensated slope of an output signal generated by the voltage compensated level-shifter and the slope of the output signal generated by the conventional cross-coupled level-shifter.

FIG. 6A is a graph 600 comparing the voltage compensated slope of the output signal 211 generated by the voltage compensated level-shifter 201 and the slope of the output signal OUT generated by the conventional cross-coupled level-shifter 100. The x-axis in the first power supply level 206 (e.g., VCCL) and the y-axis is the slope of the signal 211 in pS/V (peco-seconds/Volt). The solid lines 613 are the rise and fall slopes of the signal 211, while the dashed lines 611 and 612 are the rise and fall slopes of the OUT signal from the cross-coupled level-shifter 100.

The rise and fall slopes of the signal 211 from the voltage compensated level-shifter 201 are compensated for a wide range of the first power supply level 206. The rise and fall slopes of the signal 211 are nearly flat indicating that they are nearly constant over the first power supply level 206 range of 1.12V to 0.6V. Conversely, the rise and fall slopes 611 and 612 of the OUT signal from the cross-coupled level shifter 100 are roughly flat only from 1.12V to 0.9V, which is a very narrow range of the first power supply level 206. However, at lower power supply voltage levels, for example, 0.6V for the first power supply level 206, the slopes of the OUT signal from the cross-coupled level shifter 100 diverge and are 5 times different from one another.

Referring back to FIG. 3, the voltage compensated level-shifter 201 is an open loop design and has no cross-coupled transistors, and thus the voltage compensated level-shifter 201 eliminates any meta-stability issues exhibited by the level-shifter of FIG. 1. By eliminating meta-stability issues in the voltage compensated level-shifter 201, the propagation delay of the voltage compensated level-shifter 201 is predictable over a wide range of voltage levels.

Figure 6B:
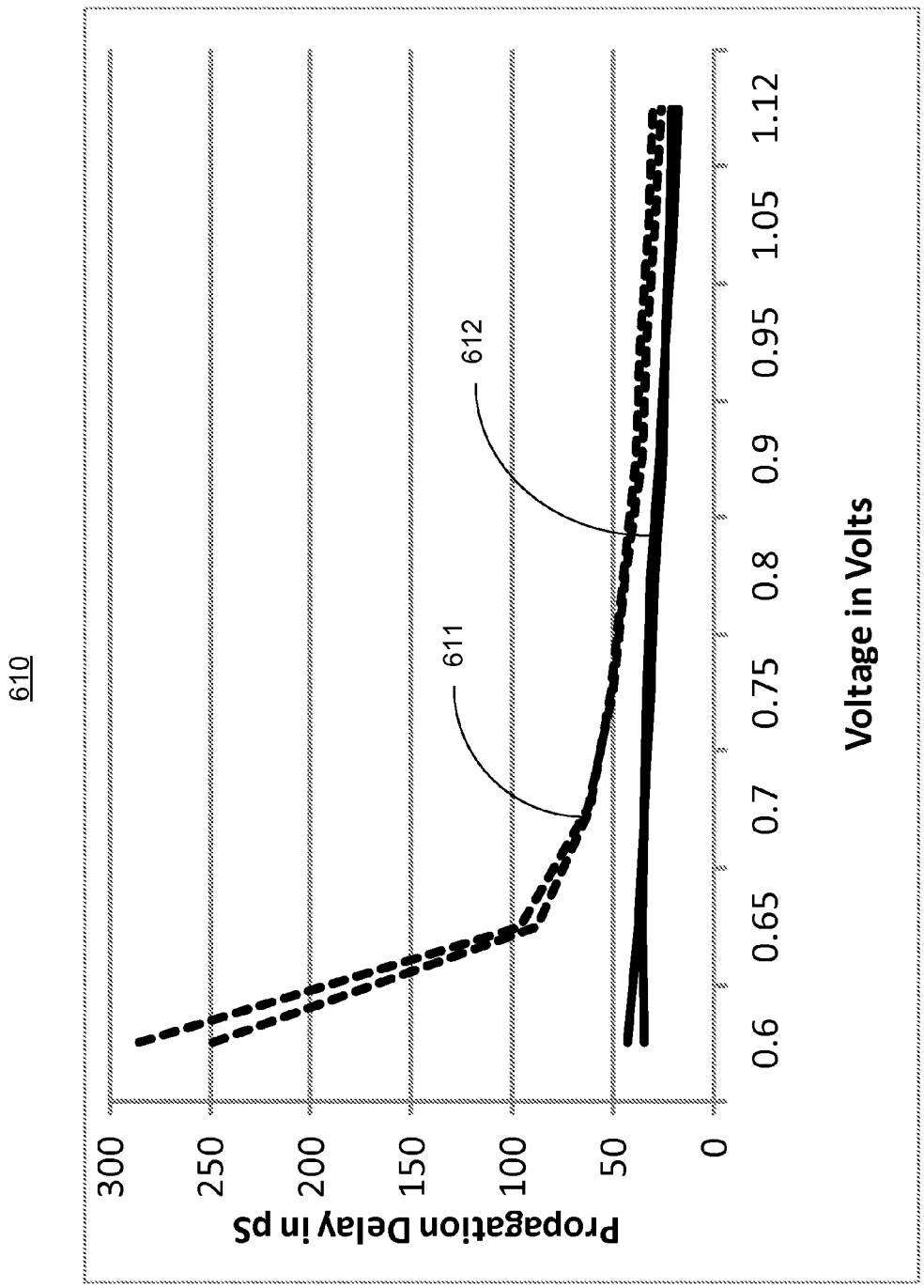
FIG. 6B is a graph comparing the voltage compensated propagation delay of the voltage compensated level-shifter and the propagation delay of the conventional cross-coupled level-shifter.

FIG. 6B is a graph 610 comparing voltage compensated propagation delay of the voltage compensated level-shifter 101 and the propagation delay of the conventional cross-coupled level-shifter 100. The x-axis is the first power supply level 206 in volts while the y-axis is propagation delay in peco-seconds. The solid lines 612 represent the propagation delay of the voltage compensated level-shifter 201. The propagation delay of the voltage compensated level-shifter 201 is nearly constant from 1.12V to 0.6V of the first power supply level 206. The dashed lines 611 represent the propagation delay of the cross-coupled level-shifter 100. The propagation delay of the cross-coupled level-shifter 100 is barely constant from 1.12V to 0.95V of the first power supply level 206, and then it dramatically increases at lower first power supply voltage levels, i.e. lower than 0.9V.

Referring back to FIG. 3, as discussed above, the voltage compensated level-shifter 201 compensates the rise and fall times of the signal 211 because the N-transistors MN1 and MN2 of the NOR gate 204 receive signals with different voltage level swings, and that the P-transistors MP1 and MP2 of the NOR gate 204 receive signals with different voltage level swings. By compensating the rise and fall times of the signal 211 over a wide range of first power supply levels 206, the duty cycle of the signal 211 is nearly 50% for a wide range of first power supply levels 206.

Figure 6C:
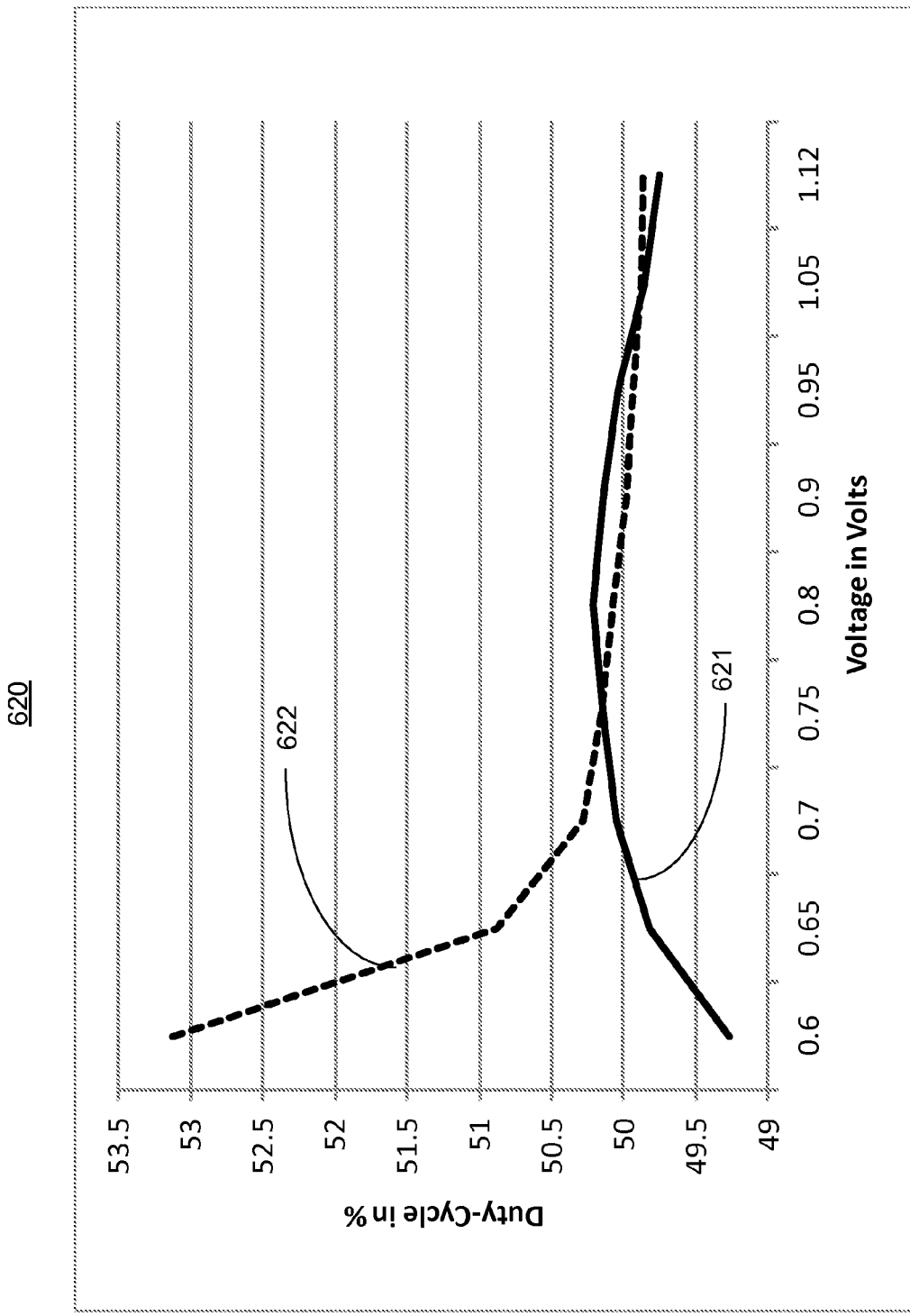
FIG. 6C is a graph comparing the voltage duty cycle of the output from the voltage compensated level-shifter and the duty cycle of the output from the conventional cross-coupled level-shifter.

FIG. 6C is a graph 620 comparing voltage duty cycle of the output from the voltage compensated level-shifter 201 and the duty cycle of the output from the conventional cross-coupled level-shifter 100. The x-axis is the first power supply level 206 in volts while the y-axis is duty cycle in percentage. The solid line 621 represents the duty cycle of the signal 211 from the voltage compensated level-shifter 201 while the dashed line 622 represents the duty cycle of the OUT signal from the cross-coupled level-shifter 100. By compensating the rise and fall times of the signal 211 over a wide range of the first power supply level 206, the duty cycle of the signal 211 is nearly 50% from 1.12 to 0.6V range of the first power supply level 206. Conversely, the duty cycle of the OUT signal from the cross-coupled level-shifter 100 loses its 50% performance level when the first power supply level 206 is reduced below 0.75V.

Figure 4:
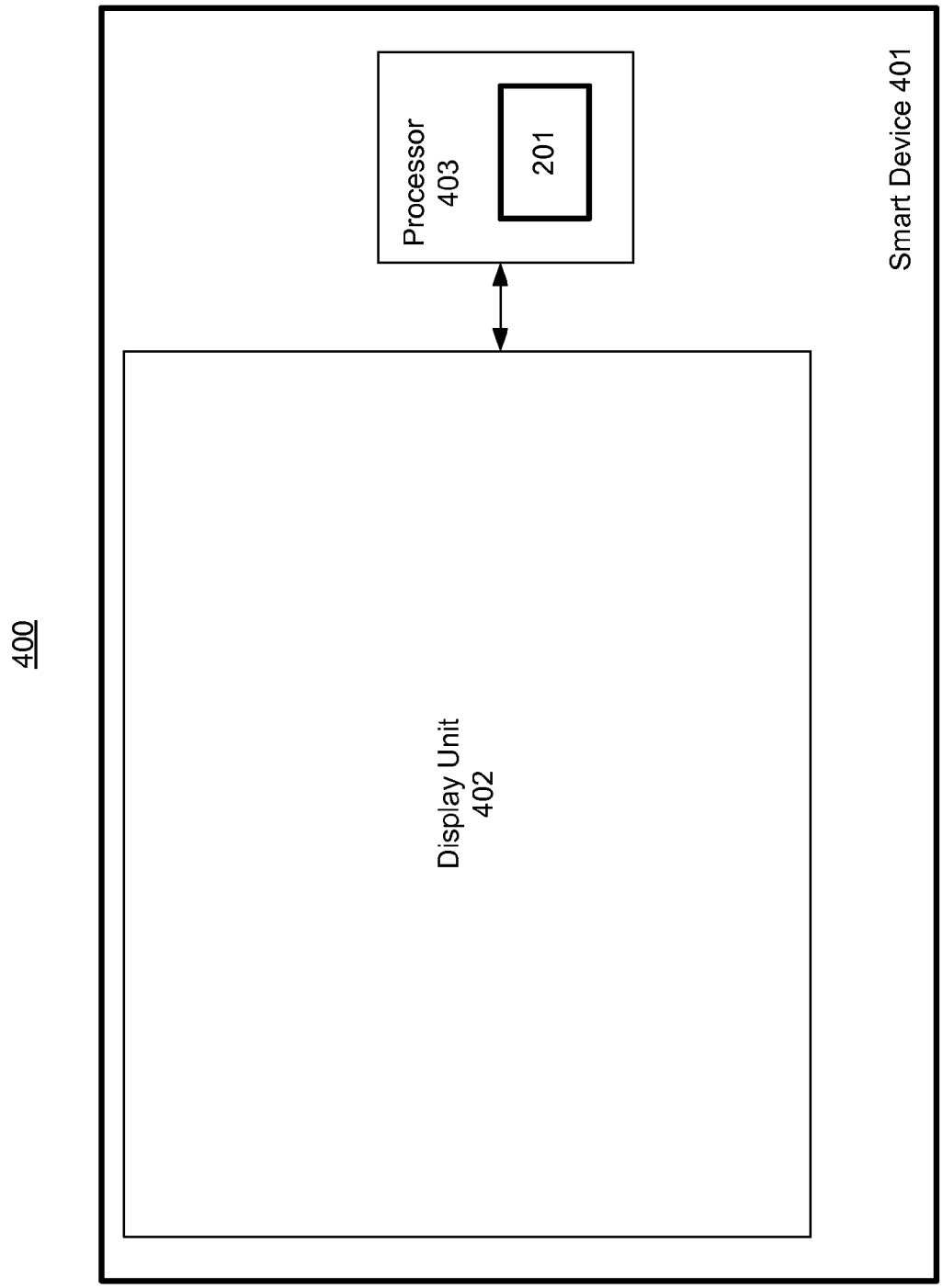
FIG. 4 is system comprising a smart device including the voltage compensated level-shifter, according to one embodiment of the invention.

FIG. 4 is a system 400 comprising a smart device 401 including the voltage compensated level-shifter 201, according to one embodiment of the invention. In one embodiment, the smart device 401 (e.g., a smart-phone, PC tablet, etc) comprises a display unit 402 communicatively coupled to a processor 403 having the voltage compensated level-shifter 201. In one embodiment, the display unit 402 is a touch pad/screen. The voltage compensated level-shifter 201 allows consumer electronics, such as the smart device 401, to operate at lower voltages without degrading the duty cycle, without experiencing variations in rise and fall times of the output signal, and without experiencing meta-stability.

The embodiments of the invention can be deployed in multiple form factors and types of connected devices, i.e. the electronic devices that include communication capabilities for them to interact with other electronic devices. For example, embodiments of the invention can be deployed in a desktop computer, a laptop computer, a net-book, a tablet, a notebook computer, a personal digital assistant (PDA), a server, a workstation, a cellular telephone, a mobile computing device, a smart-phone, e-book reader, an Internet appliance or any other type of connectable device.

In one embodiment, the system 400 comprises a network interface (not shown) to interact (by wired or wireless means) with other electronic devices. In one embodiment, the network interface is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but not limited to, the IEEE 802.11 standard and its related family, Wi-Fi, HomePlug AV (HPAV), Ultra Wide Band (UWB), Bluetooth, WiMAX, Near Field, or any form of wireless communication protocol.

FIG. 5 is a method flowchart 500 for generating a voltage compensated output from the voltage compensated level-shifter, according to one embodiment of the invention. Although the blocks in the flowchart 500 are shown in a particular order, the order of the actions can be modified. Thus, the illustrated embodiments can be performed in a different order, and some actions/blocks may be performed in parallel. Additionally, one or more actions/blocks can be omitted in various embodiments of compensating the impact of voltage changes in the level-shifter. The flowchart of FIG. 5 is illustrated with reference to the embodiments of FIGS. 1-3.

At block 501, the first inverter 203 receives the input signal 210 for level shifting from the first power supply level 206 to the second power supply level 207. At block 502, the first inverter 203 generates the first inverted signal 209 by inverting the input signal 210, the first inverted signal 209 having a logical high level of the first power supply level 206. At block 503, the second inverter 202 generates a second inverted signal 208 by inverting the input signal 210, the second inverted signal 208 having a logical high level of the second power supply level 207.

At block 504, the logical NOR gate 204 applies a logical NOR operation to inputs comprising the first and second inverted signals 208 and 209, the logical NOR operation to generate the output signal 211 which is level shifted to the second power supply level 207. In the embodiments discussed herein, the output signal 211 exhibits nearly constant rise and fall slopes, has a duty cycle compensated for variations in the first and second power supply levels 206 and 207, and provides nearly constant propagation delay for the output signal across variations in the first and second power supply levels 206 and 207. In one embodiment, the output signal 211 is received by a driver 205 for outputting a stronger signal 212. In one embodiment, the driver 205 is a third inverter operating on the second power supply level 207. In one embodiment, the driver 205 is a buffer operating on the second power supply level 207.

Figure 7:
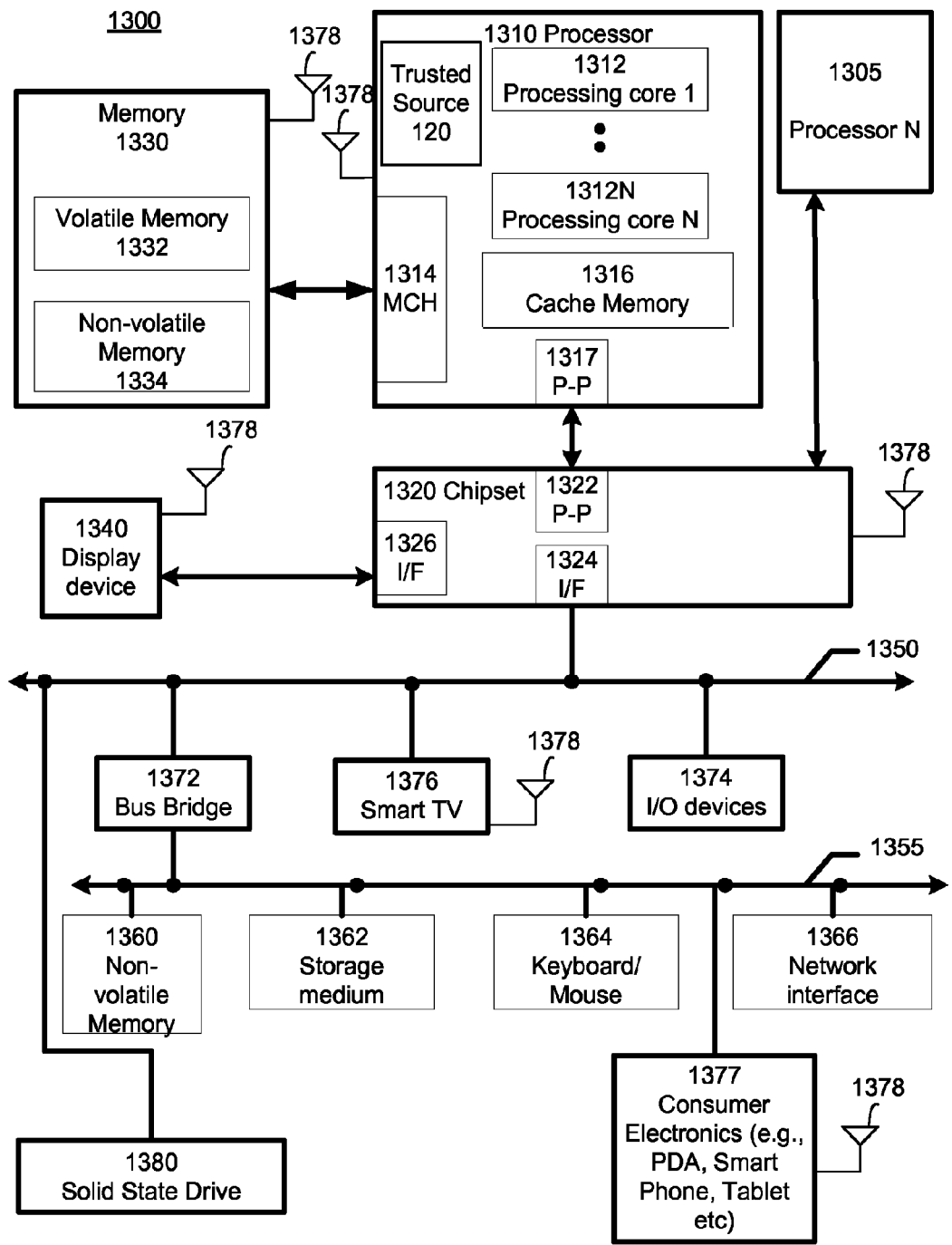
FIG. 7 is a system level diagram comprising a processor with the voltage compensated level-shifter, according to one embodiment of the invention.

FIG. 7 is a system level diagram 1300 comprising a processor with the voltage compensated level-shifter 201, according to one embodiment of the invention. In one embodiment, the system 1300 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In another embodiment, the system 1300 implements the methods disclosed herein and may be a system on a chip (SOC) system.

In one embodiment, the processor 1310 has one or more processing cores 1312 and 1312N, where 1312N represents the Nth processor core inside the processor 1310 where N is a positive integer. In one embodiment, the system 1300 includes multiple processors including processors 1310 and 1305, where processor 1305 has logic similar or identical to the logic of processor 1310. In one embodiment, the system 1300 includes multiple processors including processors 1310 and 1305 such that processor 1305 has logic that is completely independent from the logic of processor 1310. In such an embodiment, a multi-package system 1300 is a heterogeneous multi-package system because the processors 1305 and 1310 have different logic units. In one embodiment, the processing core 1312 includes, but is not limited to, pre-fetch logic to fetch instructions, decode logic to decode the instructions, execution logic to execute instructions and the like. In one embodiment, the processor 1310 has a cache memory 1316 to cache instructions and/or data of the system 1300. In another embodiment of the invention, the cache memory 1316 includes level one, level two and level three, cache memory, or any other configuration of the cache memory within the processor 1310.

In one embodiment, processor 1310 includes a memory control hub (MCH) 1314, which is operable to perform functions that enable the processor 1310 to access and communicate with a memory 1330 that includes a volatile memory 1332 and/or a non-volatile memory 1334. In one embodiment, the memory control hub (MCH) 1314 is positioned outside of the processor 1310 as an independent integrated circuit.

In one embodiment, the processor 1310 is operable to communicate with the memory 1330 and a chipset 1320. In one embodiment, the processor 1310 includes the voltage compensated level-shifter 201 of FIG. 2.

In one embodiment, the processor 1310 is also coupled to a wireless antenna 1378 to communicate with any device configured to transmit and/or receive wireless signals. In one embodiment, the wireless antenna interface 1378 operates in accordance with, but is not limited to, the IEEE 802.11 standard and its related family, HomePlug AV (HPAV), Ultra Wide Band (UWB), Bluetooth, WiMAX, or any form of wireless communication protocol.

In one embodiment, the volatile memory 1332 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 1334 includes, but is not limited to, flash memory (e.g., NAND, NOR), phase change memory (PCM), read-only memory (ROM), electrically erasable programmable read-only memory (EEPROM), or any other type of non-volatile memory device.

The memory 1330 stores information and instructions to be executed by the processor 1310. In one embodiment, memory 1330 may also store temporary variables or other intermediate information while the processor 1310 is executing instructions. In one embodiment, chipset 1320 connects with processor 1310 via Point-to-Point (PtP or P-P) interfaces 1317 and 1322. In one embodiment, chipset 1320 enables processor 1310 to connect to other modules in the system 1300. In one embodiment of the invention, interfaces 1317 and 1322 operate in accordance with a PtP communication protocol such as the INTEL® QuickPath Interconnect (QPI) or the like.

In one embodiment, the chipset 1320 is operable to communicate with the processor 1310, 1305, display device 1340, and other devices 1372, 1376, 1374, 1360, 1362, 1364, 1366, 1377, etc. In one embodiment, the chipset 1320 is also coupled to a wireless antenna 1378 to communicate with any device configured to transmit and/or receive wireless signals.

In one embodiment, chipset 1320 connects to a display device 1340 via an interface 1326. In one embodiment, the display 1340 includes, but is not limited to, liquid crystal display (LCD), plasma, cathode ray tube (CRT) display, or any other form of visual display device. In one embodiment of the invention, processor 1310 and chipset 1320 are merged into a single SOC. In addition, the chipset 1320 connects to one or more buses 1350 and 1355 that interconnect various modules 1374, 1360, 1362, 1364, and 1366. In one embodiment, buses 1350 and 1355 may be interconnected together via a bus bridge 1372 if there is a mismatch in bus speed or communication protocol. In one embodiment, chipset 1320 couples with, but is not limited to, a non-volatile memory 1360, a mass storage device(s) 1362, a keyboard/mouse 1364, and a network interface 1366 via interface 1324, smart TV 1376, consumer electronics 1377, etc.

In one embodiment, the chipset 1320 is coupled to a solid state drive (SSD) 1380. In one embodiment, the mass storage device 1362 includes, but is not limited to, a solid state drive, a hard disk drive, a universal serial bus flash memory drive, or any other form of computer data storage medium. In one embodiment, network interface 1366 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, HomePlug AV (HPAV), Ultra Wide Band (UWB), Bluetooth, WiMAX, or any form of wireless communication protocol.

While the modules shown in FIG. 7 are depicted as separate blocks within the system 1300, the functions performed by some of these blocks may be integrated within a single semiconductor circuit or may be implemented using two or more separate integrated circuits. For example, although the cache memory 1316 is depicted as a separate block within the processor 1310, the cache memory 1316 can be incorporated into the processor core 1312 respectively. In one embodiment, the system 1300 may include more than one processor/processing core.

Reference in the specification to an "embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or an element, that does not mean there is only one of the elements. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description.

For example, to further reduce leakage in the second inverter 202, more than two P-transistors may be stacked from the power supply node 207 to the output node 208. In one embodiment, an additional P-transistor is added between MP1 and the power supply node 207 to reduce leakage in the NOR gate 204, where the additional P-transistor receives the input 209.

The embodiments of the invention are intended to embrace all such alternatives, modifications, and variations as to fall within the broad scope of the appended claims.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a first inverter to receive an input signal for level shifting from a first power supply level to a second power supply level, and to generate a first inverted signal, the first inverter operating on the first power supply level;
    a second inverter to receive the input signal and to generate a second inverted signal, the second inverter operating on the second power supply level; and
    a NOR logical gate to receive the first and second inverted signals and to generate an output signal, the NOR logical gate operating on the second power supply level, wherein the output signal is level shifted to the second power supply level.

2. The apparatus of claim 1 further comprises:
a third inverter to receive the output signal and to generate a third inverted signal, the third inverter operating on the second power supply level.

3. The apparatus of claim 1 further comprises:
a buffer to receive the output signal and to generate a buffered signal, the buffer operating on the second power supply level.

4. The apparatus of claim 1, wherein the second inverter comprises at least two P-transistors in series with an N-transistor.

5. The apparatus of claim 1, wherein the NOR logical gate is a two-input gate which comprises first and second P-transistors, wherein the first inverted signal is received by the first P-transistor coupled between a second power supply node having the second power supply level and a second P-transistor, and wherein the second P-transistor is operable to receive the second inverted signal.

6. The apparatus of claim 5, wherein the two-input gate comprises first and second N-transistors, wherein the first inverted signal is received by the first N-transistor coupled between a ground power supply node and the second P-transistor, and wherein the second N-transistor is operable to receive the second inverted signal.

7. The apparatus of claim 6, wherein the first and second N-transistors to generate nearly constant rise and fall slopes for the output signal.

8. The apparatus of claim 1, wherein the NOR logical gate to:
generate nearly constant rise and fall slopes for the output signal;
generate the output signal with a duty cycle compensated for variations in the first and second power supply levels; and
provide nearly constant propagation delay for the output signal across variations in the first and second power supply levels.

9. The apparatus of claim 1, wherein the first power supply level is lower than the second power supply level.

10. The apparatus of claim 1, wherein the second inverter comprises first and second P-transistors and an N-transistor, the first and second P-transistors coupled in series to reduce leakage current.

11. The apparatus of claim 10, wherein the first P-transistor is coupled between a second power supply node and the second P-transistor, and wherein the second P-transistor is coupled to the N-transistor and is to generate the second inverted signal.

12. A method comprising:
receiving an input signal for level shifting from a first power supply level to a second power supply level;
generating a first inverted signal by inverting the input signal, the first inverted signal having a logical high level of the first power supply level;
generating a second inverted signal by inverting the input signal, the second inverted signal having a logical high level of the second power supply level; and
applying a logical NOR operation to inputs comprising the first and second inverted signals, the logical NOR operation to generate an output signal which is level shifted to the second power supply level.

13. The method of claim 12, wherein applying the logical NOR operation comprises:
generating nearly constant rise and fall slopes for the output signal;
generating the output signal with a duty cycle compensated for variations in the first and second power supply levels; and
providing nearly constant propagation delay for the output signal across variations in the first and second power supply levels,
wherein the first power supply level is lower than the second power supply level.

14. A system comprising:
a display unit;
a processor coupled to the display unit, the processor including a level shifter comprising:
a first inverter to receive an input signal for level shifting from a first power supply level to a second power supply level, and to generate a first inverted signal, the first inverter operating on the first power supply level;
a second inverter to receive the input signal and to generate a second inverted signal, the second inverter operating on the second power supply level; and
a NOR logical gate to receive the first and second inverted signals and to generate an output signal, the NOR logical gate operating on the second power supply level, wherein the output signal is level shifted to the second power supply level; and
a wireless interface for allowing the processor to communicate with another device.

15. The system of claim 14, wherein the processor further comprises:
a third inverter to receive the output signal and to generate a third inverted signal, the third inverter operating on the second power supply level.

16. The system of claim 14, wherein the processor further comprises:
a buffer to receive the output signal and to generate a buffered signal, the buffer operating on the second power supply level.

17. The system of claim 14, wherein the second inverter comprises at least two P-transistors in series with an N-transistor.

18. The system of claim 14, wherein the NOR logical gate is a two-input gate which comprises first and second P-transistors, wherein the first inverted signal is received by the first P-transistor coupled between a second power supply node having the second power supply level and a second P-transistor, and wherein the second P-transistor is operable to receive the second inverted signal.

19. The system of claim 18, wherein the two-input gate comprises first and second N-transistors, wherein the first inverted signal is received by the first N-transistor coupled between a ground power supply node and the second P-transistor, and wherein the second N-transistor is operable to receive the second inverted signal.

20. The system of claim 19, wherein the first and second N-transistors to generate nearly constant rise and fall slopes for the output signal.

21. The system of claim 14, wherein the NOR logical gate to:
generate nearly constant rise and fall slopes for the output signal;
generate the output signal with a duty cycle compensated for variations in the first and second power supply levels; and
provide nearly constant propagation delay for the output signal across variations in the first and second power supply levels.

22. The system of claim 14, wherein the first power supply level is lower than the second power supply level.

23. The system of claim 14, wherein the display unit is a touch screen.

* * * * *